(12) United States Patent
Nelson

(10) Patent No.: US 6,577,968 B2
(45) Date of Patent: Jun. 10, 2003

(54) METHOD OF ESTIMATING SIGNAL FREQUENCY

(75) Inventor: Douglas J. Nelson, Columbia, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 209 days.

(21) Appl. No.: 09/896,161

(22) Filed: Jun. 29, 2001

(65) Prior Publication Data

US 2003/0004665 A1 Jan. 2, 2003

(51) Int. Cl.[7] .............................................. G01R 23/16
(52) U.S. Cl. ...................................... 702/77; 324/76.21
(58) Field of Search .............................. 702/77, 39, 48, 702/54, 66, 69, 73, 75, 76, 182, 189, 190, 191, 193, 194, 195, 196, 197; 73/579, 580, 591, 609, 632, 862.326, 659, 602; 324/520, 525, 612, 613, 707, 76.19, 76.21, 76.22, 76.24, 118

(56) References Cited

U.S. PATENT DOCUMENTS

| | | | |
|---|---|---|---|
| 3,886,333 A | * | 5/1975 | Cohn ............................ 708/5 |
| 4,904,930 A | | 2/1990 | Nicholas |
| 5,165,051 A | | 11/1992 | Kumar |
| 5,293,114 A | | 3/1994 | McCormick et al. |
| 5,640,431 A | | 6/1997 | Bruckert et al. |
| 5,729,124 A | | 3/1998 | Lu |
| 6,160,758 A | * | 12/2000 | Spiesberger ................. 367/125 |
| 6,218,896 B1 | | 4/2001 | Becker et al. |

* cited by examiner

*Primary Examiner*—Marc S. Hoff
*Assistant Examiner*—Edward Raymond
(74) *Attorney, Agent, or Firm*—Robert D. Morelli

(57) ABSTRACT

The present invention is an method of estimating the frequency of a signal by first receiving a signal, forming a row vector, segmenting the row vector; converting the row vector to a first matrix, multiplying the first matrix by a weight, performing a Fourier transform on the result of the last step. These same steps are repeated on a delayed version of the signal. The next steps are calculating a complex conjugate for each result of the last step, forming a cross-spectrum matrix, selecting a magnitude in the cross-spectrum matrix that is above a threshold; and setting an angular frequency of the signal to either the phase of the selected magnitude, the phase of the mean of the complex numbers in the row in which appears the selected magnitude, or the selected magnitude. The frequency of the signal is then set to the estimated angular frequency divided by the product of $2\pi$ and the signal delay period. Additional rows are processed if need be.

18 Claims, 1 Drawing Sheet

METHOD OF ESTIMATING SIGNAL FREQUENCY

FIELD OF THE INVENTION

The present invention relates, in general, to measuring and testing and, in particular, to frequency spectrum analyzer by Fourier analysis.

BACKGROUND OF THE INVENTION

A classic problem in signal analysis is detecting weak tones in noise and estimating the frequency of the tone.

The most common method used in frequency estimation is the Fourier transform. However, the Fourier transform cannot resolve signals that are separated by less than the width of one transform cell.

Other common methods of frequency estimation are based on phase differentiation of the signal. These methods fail if more than one signal is present. This is because the differential phase is derived from the sum of the signal components.

A cross spectral method provides a very accurate frequency estimate in severe noise, but cannot resolve two signals which are not already separated by the Fourier transform on which the method is based.

In a typical two-dimensional Fourier analysis, a signal is sampled to form a first matrix of rows and columns, where each column represents a time segment of data. A Fast Fourier Transform (FFT) is performed on the columns of the first matrix to form a second matrix. The rows of the second matrix represent frequency and the columns represent time. That is, each row in the second matrix is a time-indexed vector, representing the time-varying spectral response of the signal at the frequency represented by the row. A second FFT is then performed on the rows of the second matrix.

In an FFT method known as the Large FFT method, a sufficient amount of data is selected from a signal of interest to form a vector, an FFT is computed for the vector, the magnitude of each element in the FFT is determined, and the element with the peak magnitude is used to estimate the frequency of the signal.

In an FFT method known as the Welch's method, a signal is sampled to form a first matrix of rows and columns. An FFT is performed on the columns of the first matrix to form a second matrix. Each entry in the second matrix is replaced with its absolute value. The rows of the second matrix are then summed. The highest sum (i.e., the peak) is selected.

In an FFT method known as the Cross-Power Spectrum method, a signal is sampled to form a first matrix of rows and columns. The signal is then delayed a user-definable period of time. The delayed signal is then sampled to form a second matrix of rows and columns. An FFT is performed on the columns of the first matrix. An FFT is performed on the columns of the second matrix. The results of the two FFTs are multiplied together to form a third matrix. The third matrix is averaged. An amplitude and phase are computed from the averaged matrix. Determine the peak amplitude and calculate the frequency corresponding thereto. The phase of the signal is estimated as being located where the peak amplitude occurs. The frequency of the signal is estimated by interpolation as follows:

$$F_{est}=F_p+(PHI(i_1, i_2, \ldots, i_n))/(2\times\pi\times DELAY),$$

where $F_{est}$ is the estimated signal frequency,

PHI is the estimated phase,

DELAY is the time by which the signal was delayed; and $F_p$ is the estimated frequency.

U.S. Pat. No. 4,904,930, entitled "METHOD OF CARRIER FREQUENCY ESTIMATION"; U.S. Pat. No. 5,165,051, entitled "MODIFIED FAST FREQUENCY ACQUISITION VIA ADAPTIVE LEAST SQUARES ALGORITHM"; U.S. Pat. No. 5,293,114, entitled "FREQUENCY MEASUREMENT RECEIVER WITH MEANS TO RESOLVE AN AMBIGUITY IN MULTIPLE FREQUENCY ESTIMATION"; U.S. Pat. No. 5,640,431, entitled "METHOD AND APPARATUS FOR OFFSET FREQUENCY ESTIMATION FOR A COHERENT RECEIVER"; U.S. Pat. No. 5,729,124, entitled "ESTIMATION OF SIGNAL FREQUENCY USING FAST WALSH TRANSFORM"; and U.S. Pat. No. 6,218,896, entitled "VECTORED DEMODULATION AND FREQUENCY ESTIMATION APPARATUS AND METHOD," each disclose a device for or method of estimating frequency, but none of these patents disclose the device for and method of estimating frequency of the present invention. U.S. Pat. Nos. 4,904,930; 5,165,051; 5,293,114; 5,640,431; 5,729,124; and 6,218,896 are hereby incorporated by reference into the specification of the present invention.

SUMMARY OF THE INVENTION

It is an object of the present invention to estimate the frequency of a signal.

It is another object of the present invention to estimate the frequency of a signal using multi-dimensional Fast Fourier Transforms (FFTs).

The present invention is a method of estimating the frequency of a signal using multidimensional Fast Fourier Transforms, where the first step of the method is receiving a signal for which its frequency is to be determined.

If the received signal is not in the form of a row vector then the second step is converting the received signal to a row vector.

The third step of the method is segmenting the row vector into a plurality of segmented row vectors.

The fourth step of the method is converting each of the plurality of segmented row vectors to a first matrix.

The fifth step of the method is multiplying each entry in the first matrix by a first weighting column-vector.

The sixth step of the method is performing a Fourier transform on each result of the fifth step.

The seventh step of the method is delaying the received signal by a user-definable period of time.

If the delayed signal is not in the form of a row vector then the eighth step of the method is converting the delayed signal into a delayed row vector.

The ninth step of the method is segmenting the delayed row vector into a plurality of segmented delayed row vectors.

The tenth step of the method is converting each of the plurality of segmented delayed row vectors to a second matrix.

The eleventh step of the method is multiplying each entry in the second matrix by a second weighting column-vector.

The twelfth step of the method is performing a Fourier transform on each result of the eleventh step.

The thirteenth step of the method is calculating the complex conjugate of each result of the twelfth step.

The fourteenth step of the method is forming a cross-spectrum matrix by multiplying each result of the sixth step by the corresponding complex conjugate calculated in the thirteenth step, where each entry in the cross-spectrum matrix includes a magnitude and a phase.

The fifteenth step of the method is selecting at least one magnitude entry in the cross-spectrum matrix that is above a user-definable threshold. In the preferred embodiment, the user-definable threshold is the average of the magnitude entries in the cross-spectrum matrix.

The sixteenth step of the method is setting an angular frequency of the signal equal to the phase of an entry in the cross-spectrum matrix that corresponds to the at least one entry selected in the fifteenth step.

The seventeenth step of the method is determining the frequency of each entry in the cross-spectrum matrix corresponding to the at least one entry selected in the fifteenth step as the corresponding estimated angular frequency divided by the product of $2\pi$ and the time delay of the seventh step and proceeding to the next step if another row of the second matrix is desired to be processed, otherwise stopping.

The eighteenth step of the method is selecting a user-definable row from the second matrix as the row vector and returning to the third step for additional processing.

DETAILED DESCRIPTION

Figure 1:
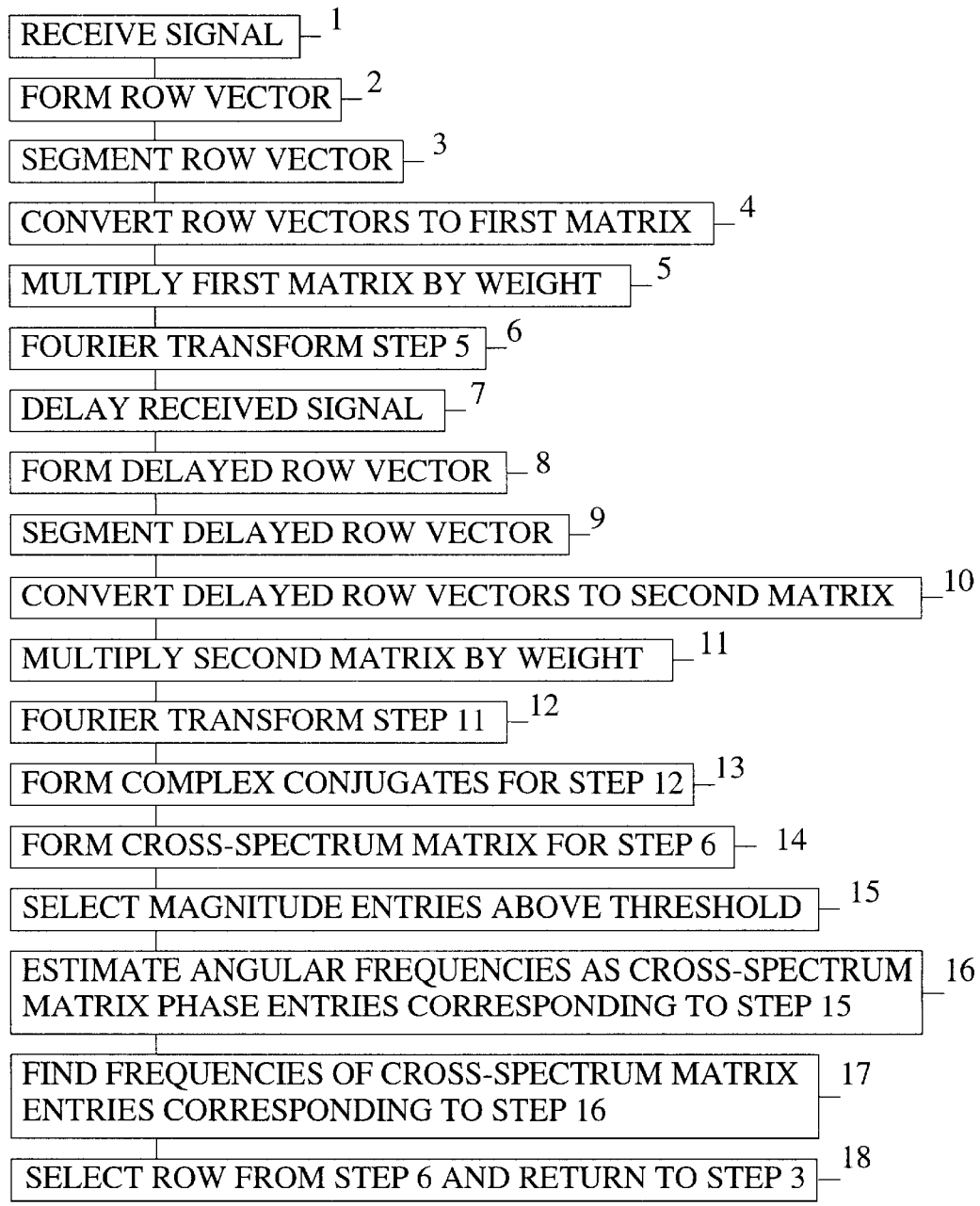
FIG. 1 is a flow-chart of the method of the present invention.

The present invention is a method of estimating the frequency of a signal using multidimensional Fast Fourier Transforms. FIG. 1 is a flow-chart of the present method.

The first step 1 of the method is receiving a signal for which its frequency is to be determined, where the received signal is sampled at a user-definable sample rate.

If the received signal is not in the form of a row vector then the second step 2 is converting the received signal to a row vector.

The third step 3 of the method is segmenting the row vector into a plurality of segmented row vectors. The segmented row vectors may overlap. For example, the first segmented row vector may included the first n entries of the row vector of the received signal, and the second segmented row vector may include n entries of the row vector of the received signal starting with the second entry of the row vector of the received signal. In this example, the two segmented row vector share all but one entry.

The fourth step 4 of the method is converting each of the plurality of segmented row vectors to a first matrix by converting each of the plurality of segmented row vectors to a column vector and combining the column vectors to form the first matrix.

The fifth step 5 of the method is multiplying each entry in the first matrix by a first weighting column-vector. The multiplication is done on a point-wise basis. In the preferred embodiment, the first weighting column-vector is a window function of length n, where the window function may be a Hanning window function, a Prolate Spheroidal window function, a Hamming window function, or any other suitable window function.

The sixth step 6 of the method is performing a Fourier transform on each result of the fifth step 5.

The seventh step 7 of the method is delaying the received signal by a user-definable period of time. In the preferred embodiment, the delay period is one sample period.

If the delayed signal is not in the form of a row vector then the eighth step 8 of the method is converting the delayed signal into a delayed row vector.

The ninth step 9 of the method is segmenting the delayed row vector into a plurality of segmented delayed row vectors. The segmented delayed row vectors may overlap as described in the third step 3 above.

The tenth step 10 of the method is converting each of the plurality of segmented delayed row vectors to a second matrix.

The eleventh step 11 of the method is multiplying each entry in the second matrix by a second weighting column-vector. The multiplication is done on a point-wise basis. In the preferred embodiment, the second weighting column-vector is a window function of length n, where the window function may be a Hanning window function, a prolate spheroidal window function, a Hamming window function, or any other suitable window function.

The twelfth step 12 of the method is performing a Fourier transform on each result of the eleventh step 11.

The thirteenth step 13 of the method is calculating the complex conjugate of each result of the twelfth step 12.

The fourteenth step 14 of the method is forming a cross-spectrum matrix by multiplying each result of the sixth step 6 by the corresponding complex conjugate calculated in the thirteenth step 13, where each entry in the cross-spectrum matrix includes a magnitude and a phase. The magnitude (i.e., absolute value) of each entry in the cross-spectrum matrix typically represents the power of the signal. The phase of each entry in the cross-spectrum matrix typically represents the angular frequency of the signal. In an alternate embodiment, the cross-spectrum matrix may be formed using the squared magnitude and the phase of each result of the sixth step 6.

The fifteenth step 15 of the method is selecting at least one magnitude entry in the cross-spectrum matrix that is above a user-definable threshold. In the preferred embodiment, the user-definable threshold is the average of the magnitude entries in the cross-spectrum matrix. In an alternate embodiment, the user-definable threshold is the average of the magnitude (i.e., the average power) of each row in the cross-spectrum matrix. If, in the alternate embodiment, the average power of a row is below a user-definable threshold then that row, and all corresponding rows in other matrices in the present invention, are discarded.

The sixteenth step 16 of the method is setting an angular frequency of the signal equal to the phase of an entry in the cross-spectrum matrix that corresponds to the at least one entry selected in the fifteenth step 15. In an alternate embodiment, the angular frequency angle of the signal is set to the phase of the mean of the complex numbers in the row in the cross-spectrum matrix that corresponds to the row in which occurs the at least one entry selected in the fifteenth step 15.

The seventeenth step 17 of the method is determining the frequency of each entry in the cross-spectrum matrix corresponding to the at least one entry selected in the fifteenth step 15 as the corresponding estimated angular frequency divided by the product of $2\pi$ and the delay of the seventh step 7 and proceeding to the next step if another row of the second matrix is desired to be processed, otherwise stopping. In an alternate embodiment, the frequency of the signal is set equal to a magnitude of an entry in the cross-spectrum matrix that corresponds to the at least one entry selected in the fifteenth step 15.

The eighteenth step 18 of the method is selecting a row from the result of the sixth step 6 as the row vector and returning to the third step 3 for additional processing.

What is claimed is:

1. A method of estimating a frequency of a signal, comprising the steps of:
   (a) receiving a signal for which its frequency is to be determined, where the received signal is sampled at a user-definable sample rate;
   (b) if the received signal is not a row vector then converting the received signal to a row vector;
   (c) segmenting the row vector into a plurality of segmented row vectors;
   (d) converting the plurality of segmented row vectors to a first matrix;
   (e) multiplying the first matrix by a first weighting column-vector;
   (f) performing a Fourier transform on the result of step (e);
   (g) delaying the received signal by a user-definable period of time;
   (h) if the delayed signal is not a row vector then converting the delayed signal into a delayed row-vector;
   (i) segmenting the delayed row-vector into a plurality of segmented delayed row-vectors;
   (j) converting the plurality of segmented delayed row-vectors to a second matrix;
   (k) multiplying the second matrix by a second weighting column-vector;
   (l) performing a Fourier transform on the result of step (k);
   (m) calculating a complex conjugate for each result of step (l);
   (n) forming a cross-spectrum matrix by multiplying each result of step (f) by the corresponding complex conjugate calculated in step (m), where each entry in the cross-spectrum matrix includes a magnitude and a phase and includes complex numbers;
   (o) selecting at least one magnitude entry in the cross-spectrum matrix that is above a user-definable threshold;
   (p) setting an angular frequency of the signal equal to a value selected from the group of values consisting of the phase of the entry in the cross-spectrum matrix that corresponds to the at least one entry selected in step (o), a phase of a mean of the complex numbers in the row in the cross-spectrum matrix that corresponds to the row in which occurs the at least one entry selected in step (o); and a magnitude of an entry in the cross-spectrum matrix that corresponds to the at least one entry selected in step (o);
   (q) determining the frequency of the signal as the frequency of each entry in the cross-spectrum matrix corresponding to the at least one entry selected in step (o) as the corresponding estimated angular frequency divided by the product of $2\pi$ and the user-definable period of time of step (g) and proceeding to the next step if another row of the second matrix is desired to be processed, otherwise stopping; and
   (r) selecting a user-definable row from the result of step (f) as the row vector and returning to step (c) for additional processing.

2. The method of claim 1, wherein the step of segmenting the row vector into a plurality of segmented row vectors is comprised of the step of segmenting the row vector into a plurality of segmented row vectors where the segmented row vectors overlap.

3. The method of claim 1, wherein the steps of multiplying the first matrix by a first weighting column-vector is comprised of multiplying the first matrix by a window function selected from the group of window functions consisting of a Hanning window function, a prolate spheroidal window function, and a Hamming window function.

4. The method of claim 1, wherein the steps of multiplying the second matrix by a second weighting column-vector is comprised of multiplying the second matrix by a window function selected from the group of window functions consisting of a Hanning window function, a prolate spheroidal window function, and a Hamming window function.

5. The method of claim 1, wherein the step of delaying the received signal by a user-definable period of time is comprised of the step of delaying the received signal by one sample period.

6. The method of claim 1, wherein the step of segmenting the delayed row vector into a plurality of segmented delayed row vectors is comprised of segmenting the delayed row vector into a plurality of segmented delayed row vectors that overlap.

7. The method of claim 1, further including the steps of:
   (a) determining the average power of each row of the cross-spectrum matrix; and
   (b) discarding each row in the cross-spectrum matrix and corresponding row in each matrix in the present invention that is below a user-definable threshold.

8. The method of claim 1, wherein the step of forming a cross-spectrum matrix by multiplying each result of step (f) by the corresponding complex conjugate calculated in step (m) is comprised of the step of forming a cross-spectrum matrix by squaring the magnitude and using the phase of each result of step (f).

9. The method of claim 1, wherein selecting at least one magnitude entry in the cross-spectrum matrix that is above a user-definable threshold is comprised of the step of selecting at least one magnitude entry in the cross-spectrum matrix that is above an average of the magnitude entries in the cross-spectrum matrix.

10. The method of claim 1, further including the step of discarding any matrix row having an average power below a user-definable threshold.

11. The method of claim 2, wherein the steps of multiplying the first matrix by a first weighting column-vector is comprised of multiplying the first matrix by a window function selected from the group of window functions consisting of a Hanning window function, a prolate spheroidal window function, and a Hamming window function.

12. The method of claim 11, wherein the steps of multiplying the second matrix by a second weighting column-vector is comprised of multiplying the second matrix by a window function selected from the group of window functions consisting of a Hanning window function, a prolate spheroidal window function, and a Hamming window function.

13. The method of claim 12, wherein the step of delaying the received signal by a user-definable period of time is comprised of the step of delaying the received signal by one sample period.

14. The method of claim 13, wherein the step of segmenting the delayed row vector into a plurality of segmented delayed row vectors is comprised of segmenting the delayed row vector into a plurality of segmented delayed row vectors that overlap.

15. The method of claim 14, further including the steps of:
  (c) determining the average power of each row of the cross-spectrum matrix; and
  (d) discarding each row in the cross-spectrum matrix and corresponding row in each matrix in the present invention that is below a user-definable threshold.

16. The method of claim 15, wherein the step of forming a cross-spectrum matrix by multiplying each result of step (f) by the corresponding complex conjugate calculated in step (m) is comprised of the step of forming a cross-spectrum matrix by squaring the magnitude and using the phase of each result of step (f).

17. The method of claim 16, wherein selecting at least one magnitude entry in the cross-spectrum matrix that is above a user-definable threshold is comprised of the step of selecting at least one magnitude entry in the cross-spectrum matrix that is above an average of the magnitude entries in the cross-spectrum matrix.

18. The method of claim 17, further including the step of discarding any matrix row having an average power below a user-definable threshold.

* * * * *